United States Patent [19]

Kogut

[11] Patent Number: 5,485,100
[45] Date of Patent: Jan. 16, 1996

[54] AUTOMATICALLY BALANCED AND TESTED BRIDGE MEASUREMENT CIRCUIT, AND METHOD

[75] Inventor: James R. Kogut, Meriden, Conn.

[73] Assignee: United Technologies Corporation, Hartford, Conn.

[21] Appl. No.: 71,556

[22] Filed: Jun. 4, 1993

[51] Int. Cl.⁶ .................................................. G01R 17/00
[52] U.S. Cl. ........................ 324/610; 324/706; 324/725
[58] Field of Search ................................. 324/610, 679, 324/680, 705, 706, 725, 98, 99 R; 73/1 B, 862.61, 862.628; 323/365, 367

[56] References Cited

U.S. PATENT DOCUMENTS

| | | | |
|---|---|---|---|
| 3,873,917 | 3/1975 | Kreuzer | 324/706 |
| 3,928,800 | 12/1975 | Strenglein | 324/99 R X |
| 4,015,209 | 3/1977 | Meyer-Ebrecht | 324/99 R X |
| 4,063,447 | 12/1977 | Mathison | 73/27 |
| 4,364,027 | 12/1982 | Murooka | 340/347 |
| 4,535,857 | 8/1985 | Haze | 177/50 |
| 4,549,620 | 10/1985 | Dee et al. | 177/60 |
| 4,926,360 | 5/1990 | Spink, Jr. | 364/571.01 |
| 4,992,724 | 2/1991 | Hisanaga et al. | 324/706 X |
| 5,197,334 | 3/1993 | Guzlak | 324/725 X |

FOREIGN PATENT DOCUMENTS 1656469  6/1991  U.S.S.R. ............................... 324/725

OTHER PUBLICATIONS

Daniel H. Sheingold, "Transducer Interfacing Handbook: A Guide to Analog Signal Conditioning"; Mar. 1980, Analog Devices, Inc.; pp. 31–43.

Pacific Perspectives, Pacific Instruments, Inc., 215 Mason Circle, Concord, California 94520, pp. 1–4, Jan. 1994, note p. 2, "APPLICATION".

Primary Examiner—Kenneth A. Wieder
Assistant Examiner—Christopher M. Tobin
Attorney, Agent, or Firm—Michael Grillo

[57] ABSTRACT

The output of a bridge measurement circuit is sampled at a time when there is no desired, or expected, bridge output signal, and a balance voltage applied to the bridge measurement circuit is automatically adjusted such that the sample bridge output signal is equivalent to a reference output signal. After the bridge is balanced, the balance voltage is automatically modified by a calibration voltage calculated to provide a known change in the sample bridge output signal, and the sample bridge output signal is compared to a reference output to automatically check the bridge measurement circuit gain. The balance voltage may be automatically modified by multiple calibration voltages, and the sample bridge output signal provides an indication of the linearity of the amplifier gain. The sample bridge output signal is monitored after a change in the balance voltage to automatically provide an indication of the bridge measurement circuit filter cutoff frequency.

11 Claims, 6 Drawing Sheets

AUTOMATICALLY BALANCED AND TESTED BRIDGE MEASUREMENT CIRCUIT, AND METHOD

TECHNICAL FIELD

The present invention relates to bridge measurement circuits, and more particularly to a system for automatically balancing, calibrating and checking the output of a bridge measurement circuit.

BACKGROUND OF THE INVENTION

Bridge circuits are often used in conjunction with measurement devices to provide highly accurate measurement of variable conditions. The measurement devices used in a bridge circuit are of the type having an impedance which varies in proportion to changes in the condition being measured, e.g., a strain gauge, thermistor, etc. A measuring device is located in at least one leg of the bridge, and an output signal from the bridge is representative of a change in the impedance of the measuring device. Highly accurate measurements are possible because a null condition is used to compare ratios of impedances in the bridge legs.

FIG. 1 is a block diagram of the present method of setting up and calibrating a strain gauge bridge measurement circuit. A strain gauge bridge circuit is used to measure the strain in a component that a strain gauge is mounted to. A strain gauge employs either a conductor or semiconductor, of small cross-sectional area, suitable for mounting to the measured surface so that it elongates or contracts with the surface and changes its resistance accordingly. The bridge is calibrated using a balance potentiometer 10. The balance potentiometer is connected across the bridge and manually adjusted for a predetermined output from an amplifier 12 connected to the output of the bridge. The gain of the amplifier is determined by shunting one leg of the bridge with a precision resistor 15 which is equivalent to a known strain.

A problem associated with balancing a bridge measurement circuit using this method is that it is very time consuming to manually adjust the balance potentiometer to achieve the desired output from the amplifier. Additionally, a precision resistor must be selected for shunting which provides a calibration within the expected range of the output. Numerous shunting resistors must be used to check for a linear response across the entire output range.

DISCLOSURE OF INVENTION

Objects of the invention include provision of a signal conditioning system for automatically balancing a bridge measurement circuit.

A further object of the present invention is to provide a system which automatically checks the gain of a bridge measurement circuit and which provides an indication of a bridge measurement circuit filter cutoff frequency.

A still further object of the present invention is to provide a system which rapidly and accurately calibrates and balances a plurality of bridge measurement circuits.

According to the present invention, a supply voltage is applied to a bridge measurement circuit, the magnitude of the supply voltage being selected based on the expected output range of the measurement circuit, a sample bridge output signal is taken at a time when there is no desired, or expected, bridge output signal, and a balance voltage applied to the bridge measurement circuit is automatically adjusted such that the sample bridge output signal is equivalent to a reference output signal.

In further accord with the present invention, the balance voltage is automatically modified by a calibration voltage calculated to provide a known change in the sample bridge output signal, and the sample bridge output signal is compared to a reference output to automatically check the bridge measurement circuit gain.

In still further accord with the present invention, the balance voltage is automatically modified by multiple calibration voltages, and the sample bridge output signal provides an indication of the linearity of the amplifier gain.

In still further accord with the present invention, the sample bridge output signal is monitored after a change in the balance voltage to automatically provide an indication of the bridge measurement circuit filter cutoff frequency.

The present invention provides a significant improvement over the prior art because a bridge measurement circuit is automatically balanced and calibrated in a rapid and accurate manner. An operator needs only to select the bridge circuits to be calibrated, and thereafter initiate automatic calibration. No further action is required. A bridge balance voltage is automatically adjusted to provide proper balancing of the bridge circuit. Thereafter, the gain of the bridge measurement circuit and the cutoff frequency of a bridge measurement circuit filter are automatically checked to ensure that the bridge output is accurate over the entire range of the bridge measurement. If the bridge balance voltage cannot be adjusted to properly balance the bridge circuit, or if the results of the gain test or frequency cutoff test indicate that there is an error in the output of the bridge circuit, the operator is automatically provided with an indication that the bridge circuit must be replaced. No manual adjustment of the bridge circuit is required by the operator.

The foregoing and other objects, features and advantages of the present invention will become apparent in light of the following detailed description of exemplary embodiments thereof, as illustrated in the accompanying drawings.

BEST MODE FOR CARRYING OUT THE INVENTION

The system of the present invention is particularly well suited for providing automatic balancing, calibration, gain testing, and filter cutoff frequency testing of a bridge measurement circuit. The system of the present invention allows rapid and accurate balancing and testing of the bridge measurement circuit and no manual adjustments are required by the operator performing the balancing and testing.

The present invention is described with respect to a bridge measurement circuit having strain gauges in each of the bridge legs. The strain gauges are mounted to a measured surface so that they each elongate or contract with that surface, thereby changing in resistance accordingly. However, the automatic balancing and testing system of the present invention may be used with any suitable bridge measuring circuit which employs sensors having an impedance which varies in relation to the condition being measured, e.g. thermistors, etc.

Figure 1:
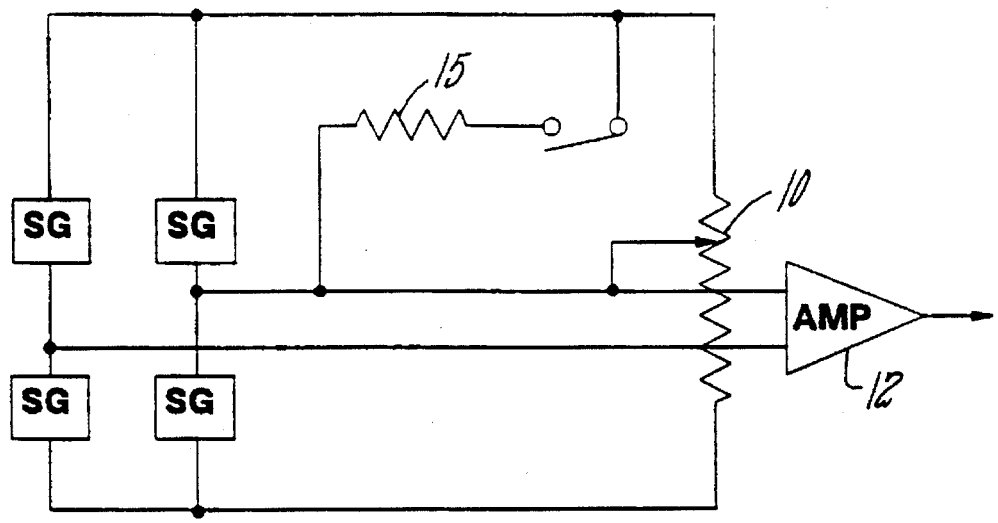
FIG. 1 is a schematic block diagram of a prior art method of balancing a bridge measurement circuit.
Figure 2:
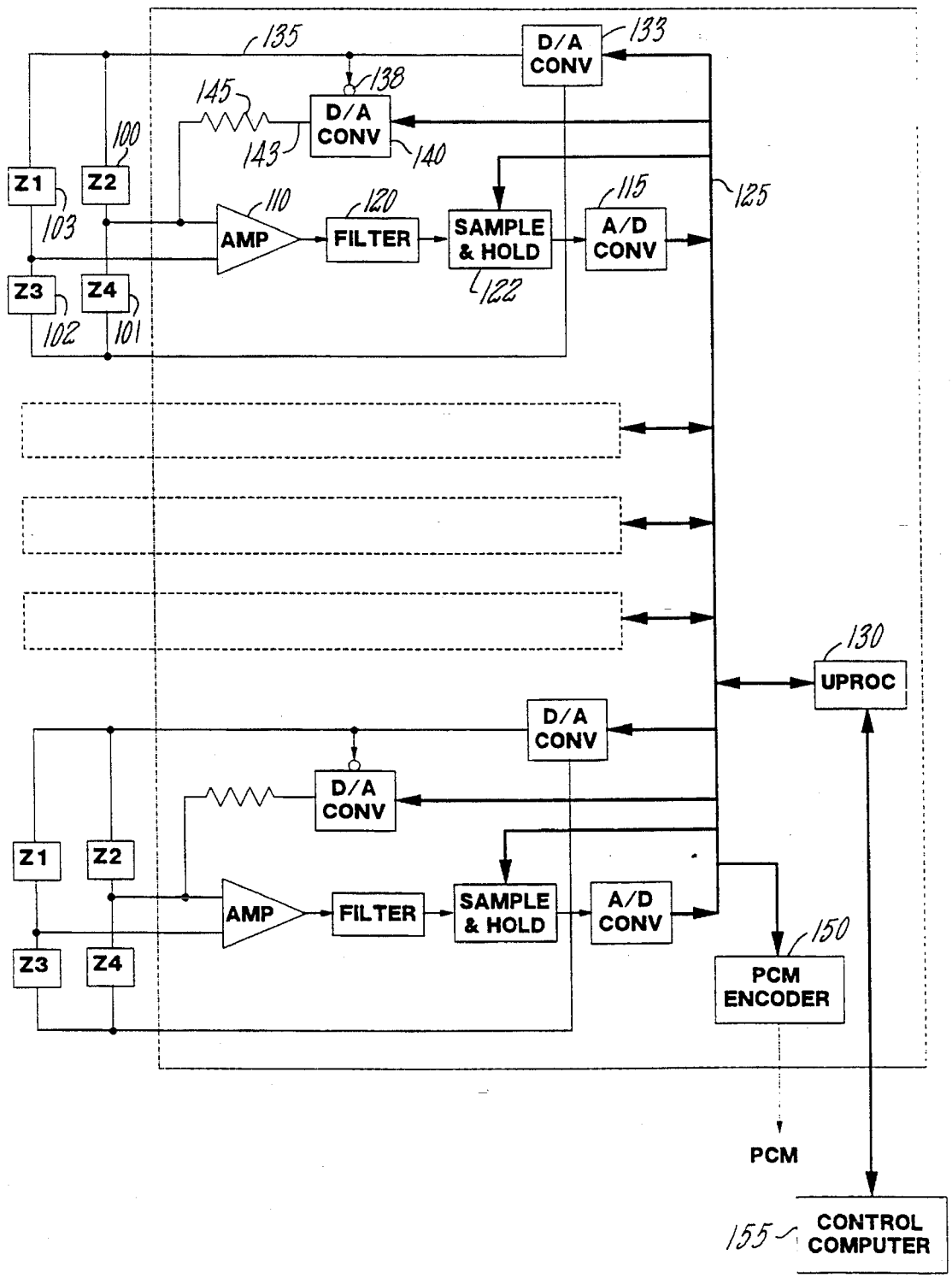
FIG. 2 is a schematic block diagram of the automatic bridge balancing system of the present invention.

Referring to FIG. 2, the bridge measuring circuit comprises 4 strain gauges, 100, 101, 102, 103 connected in a bridge circuit. The output of the bridge circuit is connected to an amplifier 110. The output of the amplifier is provided to an analog-to-digital (A/D) converter 115 via a filtering circuit 120 and a sample and hold circuit 122. Each filter circuit 120 contains a switch capacitor filter or other suitable R-C type filter network for filtering the amplified bridge measurement circuit output. The sample and hold circuit 122 samples the output of the filter 120 in response to digital commands provided to the sample and hold circuit from a databus 125. The sample and hold circuits allow the output of a plurality of bridge measuring circuits to be sampled at an instant in time. The A/D converter converts the output of the bridge measuring circuit from an analog value to a digital value which is provided via the databus 125 to a microprocessor (UPROC) 130.

A supply voltage is provided to the bridge measuring circuit by a digital-to-analog (D/A) converter 133 via a line 135. The magnitude of the supply voltage is selected based on the expected range of the bridge measuring circuit output. For example, if the measuring circuit is used to measure the strain of a steel component, then the expected output of the measurement circuit is small, and therefore a large supply voltage is selected, e.g., 10 volts, to make the measurement circuit more sensitive. Similarly, if the bridge measuring circuit is used to measure the strain of a composite component, then high strains are expected and a smaller supply voltage is selected, e.g., 1 volt. Higher voltages may also be used with steel and other metallic components because the surfaces being measured also provide a heat sink to dissipate the heat build up due to the voltage drop across the strain gage. Composite components do not provide a very good heat sink, and therefore lower bridge supply voltages are used to avoid heat effects on the composite surface. The supply voltage provided by the D/A converter 133 is directly related to the magnitude of a digital input signal provided to the D/A converter 133 from the UPROC 130 via the databus 125.

The UPROC 130 may be used to control a plurality of bridge measuring circuits, each circuit being referred to as a channel. As is described in greater detail hereinafter, the UPROC 130 is provided with a memory (not shown) which stores digital signals corresponding to each of the supply voltages for each channel.

The supply voltage is also provided as a reference voltage on the line 135 to a second D/A converter 140 via an invertor 138. The invertor 138 may be of any suitable type known in the art for reversing the polarity of the supply voltage. The second D/A converter 140 provides the bridge measuring circuit with a balance voltage on a line 143 via a balance resistor 145. The output of the bridge measuring circuit will vary in response to changes in the balance voltage. The magnitude of the balance voltage provided by the second D/A converter 140 varies incrementally in response to digital signals provided by the UPROC 130 on the databus 125. For example, if the second D/A converter 140 is a 12-bit device, then the output (balance voltage) of the converter can change in $2^{12}$ steps or counts (4096 steps) between zero and the maximum output value. Typically, the bridge measurement circuit is designed such that the bridge is balanced when the balance voltage is one-half of the bridge voltage. This corresponds to a count value of one-half of the maximum number of counts (2047 counts for a 12 bit device). As is described in greater detail hereinafter with respect to FIGS. 3 and 4, the balance voltage is automatically adjusted by the UPROC to provide accurate and reliable measurements by the bridge measuring circuit. Additionally, the balance voltage may be offset for gain and filter cutoff frequency testing.

The bridge output signals provided to the databus 125 via the A/D converter 115 in each channel are provided to a pulse code modulation (PCM) encoder circuit 150, which converts the digital signals on the databus into pulse code modulated signals which are thereafter recorded to provide an indication of the strain measured by each of the channels over the life of each component being measured. A control computer 155 is provided as a user interface with the UPROC 130 for performing automatic balancing and testing of the bridge circuits. The control computer 155 may be of any suitable type known in the art having display means and user interface means for allowing the input of operator commands and display of messages and information related to control functions.

Figure 3:
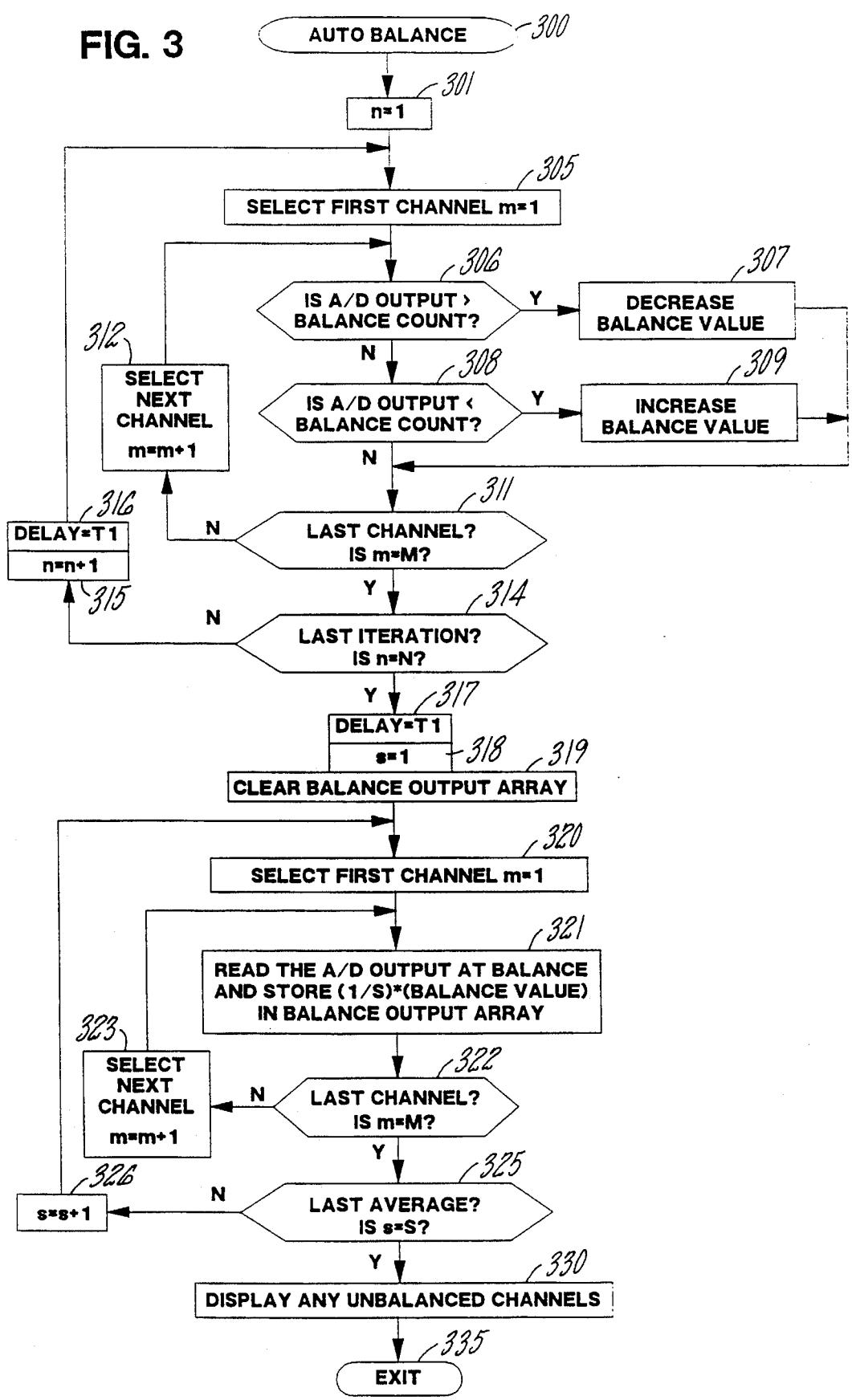
FIG. 3 is a routine implemented by the system of FIG. 2 for automatically balancing a bridge measurement circuit.

Referring also to FIG. 3, a subroutine, which is performed by the UPROC 130, is provided for automatically balancing the bridge circuits. Typically, an operator will use the control computer 155 to instruct the UPROC to perform the subroutine of FIG. 3 at a time when there is no desired, or expected, bridge output signal, i.e., when the parts being measured are not under strain. The subroutine of FIG. 3 is entered in a step 300, and then a step 301 is performed wherein an iteration counter is set equal to one. The subroutine of FIG. 3 incrementally adjusts the balance voltage for each channel. Typically, there is a time lag associated with the filter 120, and therefore the subroutine of FIG. 3 makes incremental adjustments to each channel rather than completely adjusting one channel and moving onto the next channel to thereby allow the filtered output to reach an equilibrium value.

The subroutine then performs the first iteration adjustment to each of the channels. The adjustment is performed one channel at a time, for a total of "M" channels. The subroutine first performs a step 305 wherein a channel counter "m" is set equal to one. Next, the UPROC checks if the output of the A/D converter is greater than a balance count in a test 306. The balance count corresponds to the expected bridge measuring circuit output when the bridge is in a balanced condition. For example, in a bridge measurement circuit having a 12-bit D/A converter for providing the balance voltage, the balance count will be between 0 and 4095. Typically, the balance voltage is set at one-half of the bridge voltage, and therefor the balance count is 2047 for a 12-bit device.

If the results of the test 306 are positive, then the bridge is not balanced, and the balance voltage is adjusted in a step 307. If the results of the test 306 are negative, then a test 308 is performed wherein the UPROC checks if the output of the A/D converter is less than the balanced count. If the results of the test 308 are positive, then the bridge is not balanced and a step 309 is performed wherein the balance voltage is increased. In the steps 307 and 309, the balance voltage is adjusted by the UPROC. If the balance voltage is high, the UPROC provides a digital signal on the databus to the second D/A converter to lower the balance count, thereby lowering the balance voltage. If the balance voltage is low, the UPROC provides a digital signal on the databus to the D/A converter to increase the balance count, thereby increasing the balance voltage. If the results of both of the tests 306 and 308 are negative, then the bridge is balanced, and no adjustment is made to the balance voltage.

The steps 307, 308 and 309 all reach a test 311 wherein the UPROC checks if the channel being balanced is the last channel in the sequence. If the results of the test 311 are negative, a step 312 is performed wherein the next channel is selected, and then the subroutine returns to the tests and steps 306 through 309. If the result of the test 311 is positive, all channels have been balanced in the current iteration, and a test 314 is performed wherein the UPROC checks if all the iterations (N) have been performed. The number of iterations (N) will depend of the type of D/A convertor used to provide the balance voltage. For a 12-bit device, the number of iterations will typically be set at 4096 to ensure that all channels are balanced.

If the results of the test 314 is negative, the iteration count is incremented by one in a step 315. Next, a step 316 is performed wherein the subroutine is delayed for a period T1. T1 is selected to be sufficiently long to allow all of the bridge measurement circuit filters 120 to reach equilibrium. The subroutine then returns to the steps and test 305 through 314 wherein all channels are again balanced.

If the results of the test 314 are positive, all of the channels have been adjusted for "N" iterations, and a step 317 is performed wherein the subroutine is delayed for a period T1. The subroutine then determines an average balance voltage count for each channel over a number of samples "S". The balance count is determined as an average rather than a instantaneous measurement because the output of the A/D converter may vary slightly due to noise and interference. The number of samples S is selected based on the speed of the UPROC (the speed that the subroutine is performed) and the expected frequency of electromagnetic interference causing noise, e.g., 400 Hertz or 60 Hertz. A step 318 is performed wherein an average counter "s" is set equal to 1. Next, a step 319 is performed wherein the UPROC clears a balance output memory array (balance array). The balance array is an array of memory locations provided by the UPROC. The balance array may be implement using a known type of memory device, such as an EEPROM.

The subroutine then performs a step 320 wherein a channel counter "m" is set equal to one. Next, the UPROC adds the balance count divided by S to the corresponding channel counts in the balance array in a step 321. The subroutine then performs a test 322 to determine if a balance count has been stored for all of the channels in the sequence. If the results of the test 322 are negative, a step 323 is performed wherein the next channel is selected, and then the subroutine returns to the step 321 to add the balance count divided by S for the selected channel to the balance array. If the results of the test 322 are positive, a value has been added for all of the channels, and a test 325 is performed wherein the UPROC checks if S number of samples have been added to the balance array for each of the channels. If the results of the test 325 are negative, a step 326 is performed wherein the average counter "s" is incremented by one. The subroutine then returns to the tests and tests 321 through 323. However, if the results of the test 325 are positive, an average balance count has been stored in the balance array for each of the channels.

The subroutine then displays any unbalanced channels in a step 330 and exits in a step 335. A channel is determined to be unbalanced if the balance count stored in the balance array differs from a corresponding reference balance count by a threshold value, e.g., 2%. If any of the channels are unbalanced, the balance subroutine of FIG. 3 may be repeated to attempt to balance any unbalanced channels.

Figure 4:
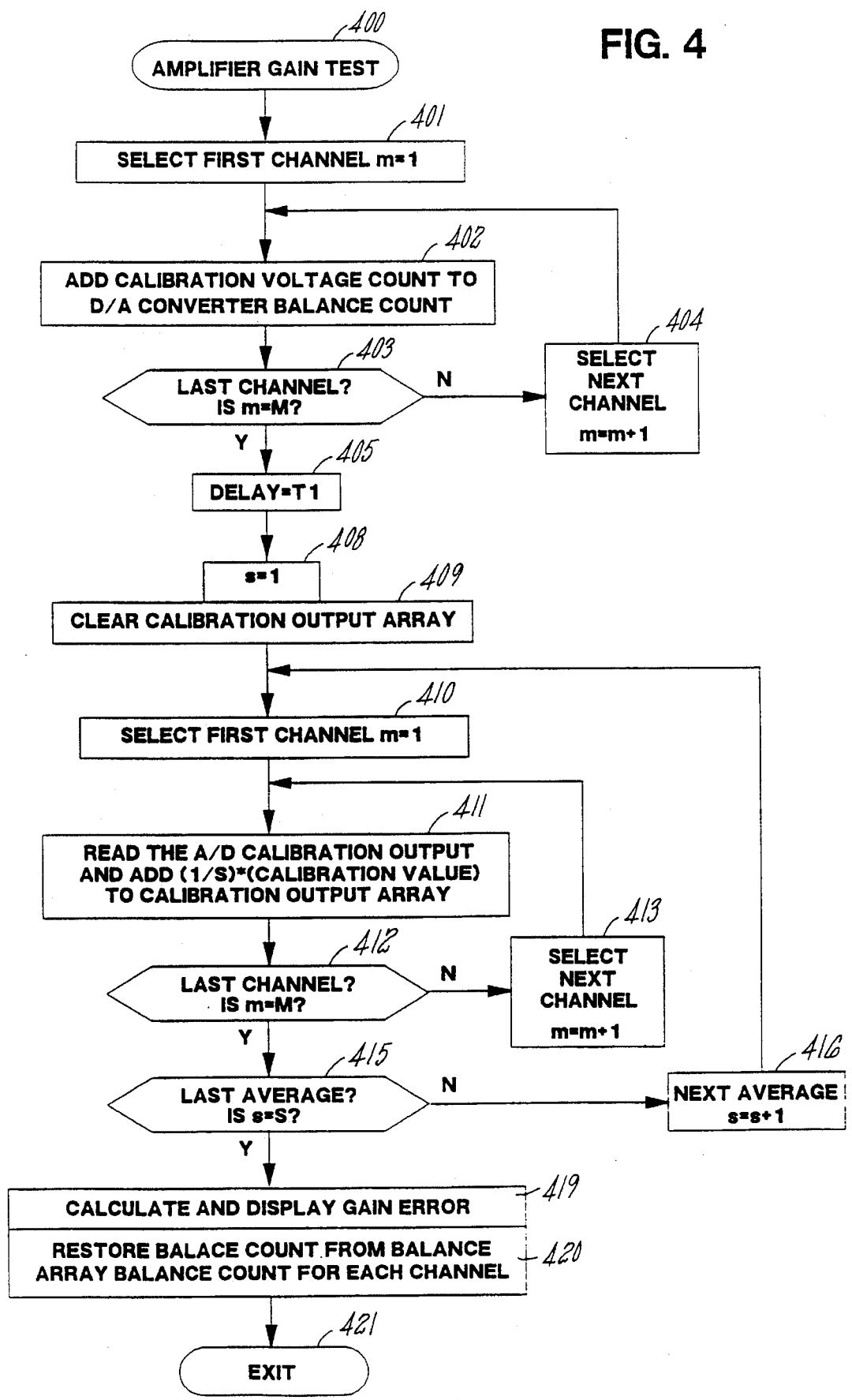
FIG. 4 is a routine implemented by the system of FIG. 2 for automatically checking the gain of the bridge measurement circuit.

Once the bridge is balanced, the overall gain of the bridge measurement circuit, including the gain provided by the amplifier 110, may be tested using the subroutine of FIG. 4. The operator selects the gain test using the control computer 155, to provide an automatic gain test signal and the UPROC enters the subroutine of FIG. 4 in a step 400. Next, a step 401 is performed wherein a channel counter is set equal to one. A step 402 is then performed wherein a calibration voltage is added to the balance voltage for each of the channels. The UPROC determines the calibration value based on the supply voltage for the specific channel. The balance voltage is increased in each channel by increasing the balance count by a count corresponding to the calibration value, thereby increasing the balance voltage by a calibration voltage. The UPROC then checks if a calibration voltage has been added to the last channel in a test 403. If the results of the test 403 are negative, the channel counter is incremented in a step 404, and then steps 402 and 403 are again performed. If the results of the test 403 are positive, a step 405 is performed wherein the subroutine is delayed for a period T1. T1 is selected to be sufficiently long to allow all of the bridge measurement circuit filters 120 to reach equilibrium.

The subroutine then determines an average calibration voltage count for each channel over a number of samples "S". As described hereinbefore with respect to the balance voltage, the calibration count is determined as an average rather than a instantaneous measurement because the output of the A/D convertor may vary slightly due to noise and interference. A step 408 is then performed wherein an average counter "s" is set equal to 1. Next, a step 409 is performed wherein the UPROC clears a calibration output memory array (calibration array). The calibration array is an array of memory locations provided by the UPROC. The calibration array may be implement using a known type of memory device, such as an EEPROM.

The subroutine then performs a step 410 wherein a channel counter "m" is set equal to one. Next, the UPROC adds the calibration count divided by S to the corresponding channel counts in the calibration array in a step 411. The subroutine then performs a test 412 to determine if a calibration count has been stored for all of the channels in the sequence. If the results of the test 412 are negative, a step 413 is performed wherein the next channel is selected, and then the subroutine returns to the step 411 to add the calibration count divided by S for the selected channel to the calibration array. If the results of the test 412 are positive, a value has been added for all of the channels, and a test 415 is performed wherein the UPROC checks if S number of samples have been added to the calibration array for each of the channels. If the results of the test 415 are negative, a step 416 is performed wherein the average counter "s" is incremented by one. The subroutine then returns to the step and tests 411 through 413. However, if the results of the test 415 is positive, an average calibration count has been stored in the calibration array for each of the channels.

The values in the calibration array are indicative of the bridge measurement circuit gain for each channel. Next, the UPROC performs a step 419 wherein the values in the calibration array are compared to the predicted gain, and any gain error greater than a threshold value, e.g., >2%, is displayed on the control computer. A step 420 is then performed wherein the balance voltage for each of the channels is returned to the corresponding value stored in the balance array. The subroutine then exits in a step 421.

Figure 5A:
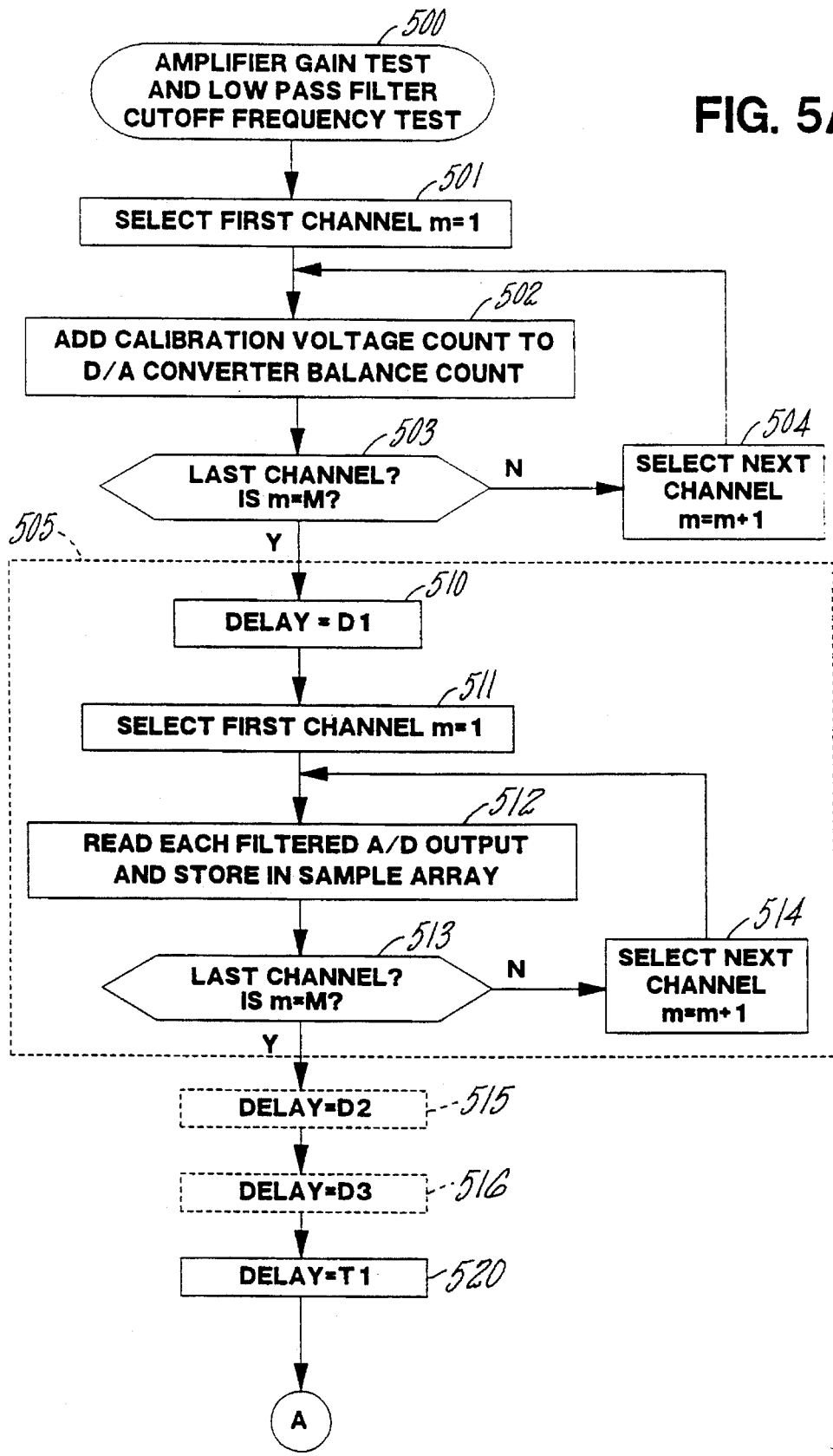
FIGS. 5A and 5B are a routing implement by the system of FIG. 2 for automatically checking the cutoff frequency of a bridge measurement circuit filter and the gain of the bridge measurement circuit.
Figure 5B:
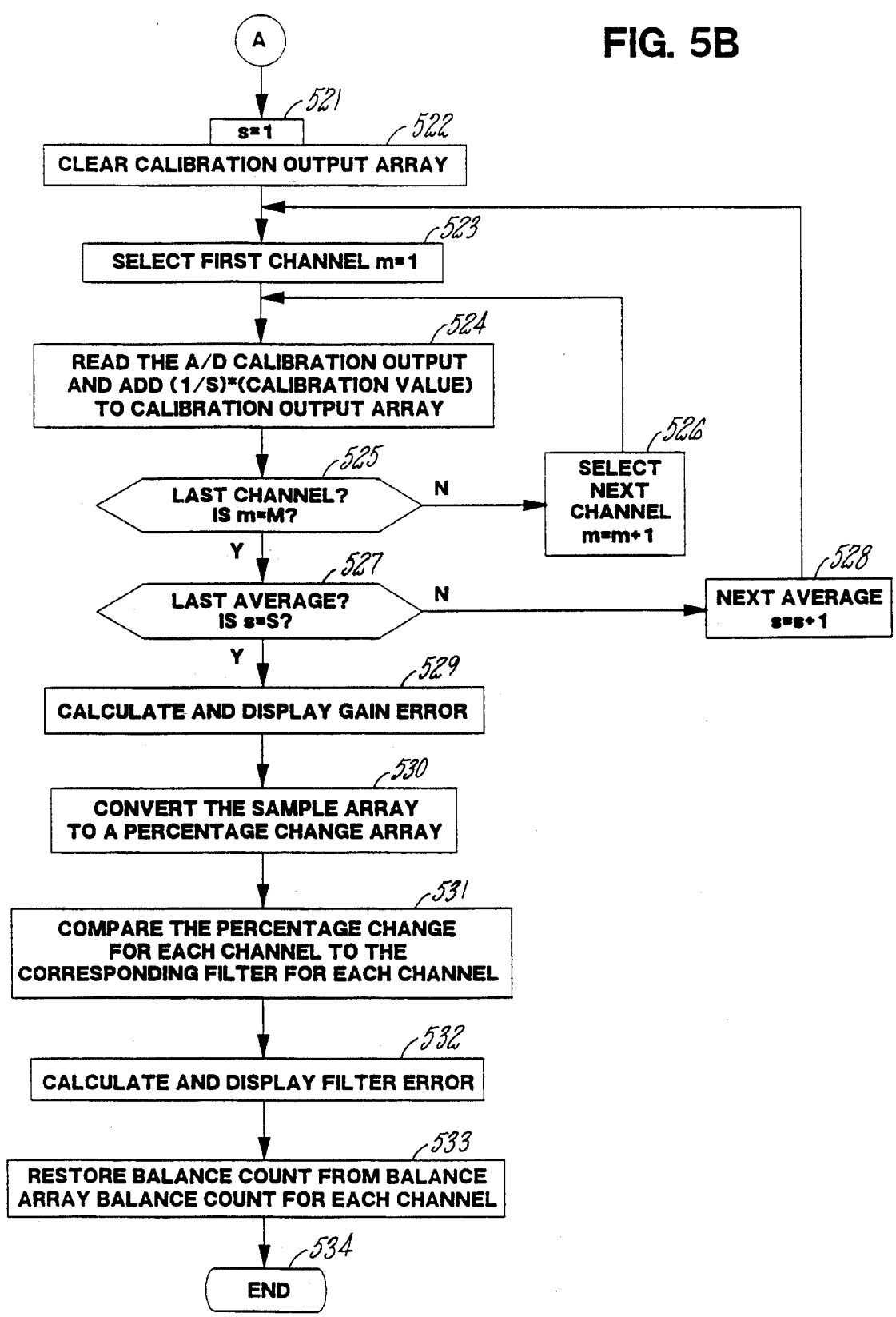

The subroutine of FIGS. 5A and 5B may be used to test both bridge measurement circuit gain and filter cutoff frequency, in response to an amplification gain test command signal which the operator causes via the control computer 155. First, the steps and test 501 through 504 are performed wherein the calibration voltage is added to the balance voltage for each channel. Next, a portion 505 of the subroutine is performed, including steps and test 510 through 514, wherein the output of each channel is instantaneously sampled after a first delay period, D1, and the values are stored in a sample output memory array (sample array). A portion 515 of the subroutine is then performed wherein the output of each channel is instantaneously sampled and stored in the sample array after a second delay period, D2. The output may again be sampled after a third delay period, D3, or as many samples as required.

The values stored in the sample array are used to test the cutoff frequency for each channel. The time it takes for the output of each channel to reach an equilibrium value after a step input varies depending on the cutoff frequency of the filter in that channel. The larger the frequency of the filter, the faster the output reaches its equilibrium value. Additionally, the percentage change in output after a step input should be the same for two channels having the same filter frequency. Therefore, the cutoff frequency for each channel can be determined by comparing the percentage change in the output of each channel at the various sample time, i.e., D1, D2, D3, etc., to the expected frequency response for each channel.

Once all of the required values are stored in the sample array, a step 520 is performed wherein the subroutine is delayed for a period T1. T1 is selected to be sufficiently long to ensure that all of the bridge measurement circuit filters 120 have reached equilibrium. The UPROC then performs steps and tests 521 through 529 wherein an average calibration count is stored in the calibration array for each channel, the values in the calibration array are compared to the predicted gain, and any gain error greater than a threshold value, e.g., >2%, is displayed on the control computer.

Steps 530 and 531 are then performed for filter cutoff testing wherein the sample array is converted to a percentage change array and the percentage change for each channel is compared to the expected frequency response based on the corresponding filter in each channel. Filter errors greater than a threshold value, e.g., 5%, are displayed on the control computer in a step 532. A step 533 is then performed wherein the balance voltage for each of the channels is returned to the corresponding value stored in the balance array. The subroutine then exits in a step 534.

Although the invention has been described and illustrated with respect to exemplary embodiments thereof, it should be understood by those skilled in the art that the foregoing and various other changes, omissions and additions may be made therein and thereto, without departing from the spirit and scope of the present invention.

I claim:

1. A bridge measurement circuit comprising:

four legs connected as a bridge, at least one of which comprises a variable impedance device the impedance of which varies in relation to a quantity being measured;

output terminals, connected across a first pair of opposite apexes of said bridge, for providing an output signal indicative of said quantity being measured;

supply voltage means for providing a supply voltage across a second pair of opposite apexes of said bridge measurement circuit;

signal processing means;

balance voltage means responsive to said signal processing means for providing a balance voltage to one of said output terminals of the bridge measurement circuit, the magnitude of said output signal varying in response to changes in said balance voltage; and control means for selectively providing an amplification gain test command signal to said signal processing means;

said signal processing means responsive to said output signal for automatically adjusting said balance voltage such that said output signal is equal to a predetermined reference signal, said signal processing means responsive to said amplification gain test command signal for adjusting said balance voltage by a predetermined value, and for comparing said output signal to a predetermined gain reference signal and for providing an indication of the bridge measurement circuit amplification gain in response to said comparison.

2. A bridge measurement circuit according to claim 1 wherein said signal processing means is further responsive to said amplification gain test command signal for automatically sampling said output signal at predetermined periods after said balance voltage is adjusted by said predetermined value to provide an indication of bridge measurement circuit cutoff frequency.

3. A bridge measurement circuit according to claim 1 wherein said supply voltage means comprises a digital to analog converter, the magnitude of said supply voltage being directly related to digital signals provided to said digital to analog converter by said signal processing means.

4. A bridge measurement circuit according to claim 1 wherein said control means is an operator actuable control.

5. A bridge measurement circuit comprising:

four legs connected as a bridge, at least one of which comprises a variable impedance device the impedance of which varies in relation to a quantity being measured;

output terminals, connected across a first pair of opposite apexes of said bridge, for providing a bridge output signal indicative of said quantity being measured;

supply voltage means for providing a supply voltage across a second pair of opposite apexes of said bridge measurement circuit, the magnitude of said supply voltage being selected based on the expected output range of the bridge measurement circuit;

balance voltage means for providing a balance voltage to one of said output terminals of the bridge measurement circuit, the magnitude of said output signal varying in response to changes in said balance voltage;

control means for providing an automatic balance command signal, said automatic balance command signal only being provided when said output signal is a known or expected quantity; and signal processing means response to said automatic balance command signal for automatically adjusting said balance voltage such that said output signal is equal to a predetermined reference signal.

6. A bridge measurement circuit according to claim 5 further comprising:

said control means including means for selectively providing an amplification gain test command signal to said signal processing means;

said signal processing means comprising means for adjusting said balance voltage by a predetermined value in response to said amplification gain test command signal provided by said control means; and said signal processing means being responsive to said amplification gain test command signal for comparing said output signal to a predetermined gain reference signal and for providing an indication of the bridge measurement circuit amplification gain in response to said comparison.

7. A bridge measurement circuit according to claim 1 further comprising:

filter means connected to said output terminals for filtering said bridge output signal; and said signal processing means automatically sampling said output signal at predetermined periods after said balance voltage is adjusted by said predetermined value to provide an indication of said filter means cutoff frequency.

8. A bridge measurement circuit according to claim 5 wherein said control means is an operator actuable control.

9. A bridge measurement circuit according to claim 5 wherein said supply voltage means comprises a digital to analog converter, the magnitude of said supply voltage being directly related to digital signals provided to said digital to analog converter by said signal processing means.

10. A method for automatically balancing a bridge measurement circuit having four legs connected as a bridge, at least one leg of which comprises a variable impedance device the impedance of which varies in relation to a quantity being measured and output terminals, connected across a first pair of opposite apexes of said bridge, for providing a bridge output signal indicative of said quantity being measured, comprising the steps of:

providing a supply voltage across a second pair of opposite apexes of said bridge measurement circuit;

providing a balance voltage to one of said output terminals of the bridge measurement circuit, the magnitude of said output signal varying in response to changes in said balance voltage;

then sampling said output signal when said output signal is a known or expected quantity;

automatically adjusting said balance voltage such that said output signal is equal to a predetermined signal;

then adjusting said balance voltage by a predetermined value; and comparing said output signal to a predetermined gain reference signal for providing an indication of the bridge measurement circuit amplification gain.

11. The method of claim 10 further comprising the step of automatically sampling said output signal at predetermined periods after said balance voltage is adjusted by said predetermined value to provide an indication of bridge measurement circuit cutoff frequency.

* * * * *